(12) United States Patent
Dobbek et al.

(10) Patent No.: US 8,280,941 B2
(45) Date of Patent: Oct. 2, 2012

(54) METHOD AND SYSTEM FOR PERFORMING CALCULATIONS USING FIXED POINT MICROPROCESSOR HARDWARE

(75) Inventors: Jeffrey J. Dobbek, Morgan Hill, CA (US); Kirk Hwang, Palo Alto, CA (US)

(73) Assignee: HGST Netherlands B.V., Amsterdam (NL)

( * ) Notice: Subject to any disclaimer, the term of this patent is extended or adjusted under 35 U.S.C. 154(b) by 1321 days.

(21) Appl. No.: 12/004,250

(22) Filed: Dec. 19, 2007

(65) Prior Publication Data

US 2009/0182795 A1    Jul. 16, 2009

(51) Int. Cl.
*G06F 7/52* (2006.01)
*G06F 7/44* (2006.01)
*G06F 15/00* (2006.01)

(52) U.S. Cl. .................. 708/625; 708/503; 708/603

(58) Field of Classification Search .............. 708/205, 708/208, 503, 603, 625
See application file for complete search history.

(56) References Cited

U.S. PATENT DOCUMENTS

| | | | | |
|---|---|---|---|---|
| 5,029,121 | A  * | 7/1991 | Kawata et al. | 708/319 |
| 6,505,221 | B1 * | 1/2003 | Maschmann | 708/306 |
| 6,523,050 | B1 * | 2/2003 | Dhablania et al. | 708/204 |
| 7,225,216 | B1 | 5/2007 | Wyland | |
| 2006/0195497 | A1 | 8/2006 | Dobbek et al. | |
| 2006/0195498 | A1 | 8/2006 | Dobbek et al. | |
| 2006/0200732 | A1 | 9/2006 | Dobbek et al. | |
| 2006/0294175 | A1 | 12/2006 | Koob et al. | |
| 2007/0043795 | A1 | 2/2007 | Dance et al. | |
| 2007/0050434 | A1 | 3/2007 | Lutz et al. | |
| 2007/0061391 | A1 | 3/2007 | Tan et al. | |
| 2007/0168908 | A1 | 7/2007 | Paolucci et al. | |
| 2007/0185953 | A1 | 8/2007 | Prokopenko et al. | |
| 2007/0203965 | A1 | 8/2007 | Reynolds | |
| 2007/0252733 | A1 | 11/2007 | Thebault et al. | |

FOREIGN PATENT DOCUMENTS

JP            05040605 A   *   2/1993

* cited by examiner

*Primary Examiner* — Chuong D Ngo
(74) *Attorney, Agent, or Firm* — G. Marlin Knight

(57) ABSTRACT

A method and system are described for performing an arithmetic operation such as multiplication or division of a fixed point variable measured at runtime by a floating point constant known at compile-time. The floating point constant is converted into a mantissa and a base-2 exponent at compile-time. The mantissa and exponent are preferably combined into a single unit (a word) of memory. At runtime either single multiplication and accumulation or matrix multiplication and accumulation is preferably achieved by a microprocessor or DSP instruction designed to use the mantissa-exponent pairs stored in a word of memory. The microprocessor instruction multiplies a fixed point runtime variable x by the mantissa and the result is shifted to the right or left as indicated by the exponent, which is preferably a 2's complement number. The complete instruction sequence to perform the multiplication can be made reentrant and can be pipelined.

15 Claims, 5 Drawing Sheets

US 8,280,941 B2

METHOD AND SYSTEM FOR PERFORMING CALCULATIONS USING FIXED POINT MICROPROCESSOR HARDWARE

FIELD OF THE INVENTION

The invention relates generally to methods and systems for performing calculations using digital processing systems, microprocessors or digital signal processors.

BACKGROUND

Because calculations with floating-point numbers can require significant computing power, some computers include special hardware for performing floating-point arithmetic called floating point processors (FPP), math coprocessors, etc. However, low-cost digital signal processors, microprocessors and microcontrollers such as those used in disk drives do not have floating-point processors, so when needed, floating-point arithmetic is performed using fixed bit registers with software routines providing the additional capability lacking in the hardware. Techniques for performing these floating-point calculations in an efficient way using the hardware and software tools that are readily available for embedded systems are desirable.

In theory floating-point numbers do not have a fixed number of digits before and after the decimal point, thereby allowing for the representation of very small or very large numbers. However, digital computer representations of floating-point numbers are usually approximations because a limited number of bits of memory are allocated to encode the numbers. The more coarse the approximation the faster calculations can proceed, but there is, of course, a loss of precision. Managing these tradeoffs is one of the design problems for many systems.

Single chip digital signal processors (DSPs) are specialized microprocessors designed for fast, real-time computations. One common feature of DSPs is the "multiply and/or accumulate" instruction, or MAC. This instruction multiplies two values and stores the result in the accumulator in a single clock cycle. Fixed-point processors use a modified form of integers for calculations. Numbers entered as real values are scaled using larger numbers and then rounded or truncated to an integer. The processor considers the scale value n (from number*$2^n$) and uses this to determine the location of the fixed decimal point. For example, the number 1.75 could be represented as a 4-bit integer 7 (i.e. '0111') with a scale of 2. The scale value of 2 means that the first two bits are for the value (and sign for 2's complement numbers) to the left of the decimal, the third bit represents "0.5" and the fourth bit to represents "0.25". The scale value is a shift of the decimal point. A 4-bit number where the first 2 bits represent the integer portion and the second two represent the fraction is commonly referred to as a 2.2 format.

Other standard ways to represent numbers include representing floating point numbers as an "exponent", "significand", and "sign bit". The encoding of a floating point number into a binary number can be done by normalizing the number by shifting the bits either left or right until the shifted result lies between 1 and 0.5 if the exponent is a power of 2. (If the exponent is a power of 16, the shifted result lies between 1 and 0.0625 (1/16).) A left-shift by one bit corresponds to multiplying by 2, and a right-shift corresponds to dividing by 2. The number of bit-positions shifted to normalize the number can be recorded as a signed integer. The negative of this integer (i.e., the number of bit-shifts required to recover the original number) can be defined as the exponent. Whether the right or left shift is assigned to the positive value is not significant. The normalized number between ½ and 1 is typically called the significand, because it contains the significant bits of the number. This floating point encoding is analogous to scientific notation for decimal numbers. The word mantissa is often used as a synonym for significand.

An IEEE standard defines "Fp32" as a single precision floating-point format in which a floating point number is represented by a sign bit, eight exponent bits, and 23 significand bits. The exponent is biased upward by 127 so that exponents in the range $2^{-126}$ to $2^{127}$ are represented using integers from 1 to 254. For "normal" numbers, the 23 significand bits are interpreted as the fractional portion of a 24-bit mantissa with an implied 1 as the integer portion.

U.S. Pat. No. 7,225,216 to Wyland (issued May 29, 2007) describes a floating point multiply-accumulator that uses "mantissa logic" for combining a mantissa portion of floating point inputs and "exponent logic" coupled to the "mantissa logic." The exponent logic adjusts the combination of an exponent portion of the floating point inputs by a predetermined value to produce a shift amount and allows pipeline stages in the mantissa logic, wherein an unnormalized floating point result is produced from the mantissa logic on each clock cycle.

Published application 2006/0195497 by Dobbek, et al. (Aug. 31, 2006) describes a shift process for a digital signal processor for shifting an operand to either maximum or the minimum value depending on the bit of data input when saturation occurs. A saturation detection circuit is combined with an arithmetic shifter and a final decision multiplexor. The final decision multiplexor receives the output from the arithmetic shifter and the saturated value from the saturation circuit. When saturation is detected by the saturation detection circuit, the final decision multiplexor selects the saturate minimum or the saturate maximum depending on whether the most significant bit of the data in equals one or zero, respectively.

In published application 20060294175 Koob, et al. (Dec. 28, 2006) describe a method of counting leading zeros or ones in a data word in a digital signal processor. During operation, the execution unit can receive a data word that has a width of N bits. The execution unit can sign extend the data word to a wider temporary data word. The temporary data word can be input to a counter to count the leading zeros within the temporary data word to get a result.

In published application 0060200732 Dobbek, et al. (Sep. 7, 2006) describe a processor based nested form polynomial engine. An instruction causes a processor to set coefficient and data address pointers for evaluating a polynomial, to load loading a coefficient and data operand into a coefficient register and a data register, respectively, to multiply the contents of the coefficient register and data register to produce a product, to add a next coefficient operand to the product to produce a sum, to provide the sum to an accumulator and to repeat the loading, multiplying, adding and providing until evaluation of the polynomial is complete.

The development of computer programs for embedded systems involves the use of software programs such as compilers or assemblers that translate text instructions entered by the programmers into object code or machine language. In the following the term "compiler" will be used to encompass assemblers and similar programs. There are calculations and translations that can be made at "compile-time" while others can only be made at runtime. Because compile-time calculations are essentially done only once, efficiencies can be gained by performing calculations at compile-time rather than at runtime whenever possible.

There are many reasons to use vector and/or matrix operations in embedded control systems, but the large number of calculations required make efficiency critical. Examples of vector and or matrix operations include estimation of variables in mechanical systems that involve translating a model of state variables into differential equations well known in the art such as $$d(\underline{X})/dt = A * \underline{X} + B * \underline{U}$$

where $\underline{X}$ is a vector of states such as position, velocity and acceleration. A is a matrix which couples derivatives of states with the states, $\underline{U}$ is a vector of inputs such as current to a motor, and B is a matrix which couples inputs to the states. This state space can be converted from the form above into digital state space $$\underline{X}[k+1] = \text{Phi} * \underline{X}[k] + \text{Gamma} * \underline{U}[k]$$

where $\underline{X}[k+1]$ is the state prediction for next sample, $\underline{X}[k]$ is the state for the current position, phi is the digitized coupling matrix to map state into next state as function of only $\underline{X}[k]$ and gamma is the coupling matrix to map the forcing function from inputs to $\underline{X}[k]$. This example is well known in the art as a digital state space predictor. Another application is filtering where the output of a filter is simply the dot product (vector*vector) of coefficients multiplied by a history of previous inputs and/or outputs. The well known equation for the canonical form of a filter is the output:

$$Y[n] = c_{y1} * Y[n-1] + c_{y2} * Y[n-2] + \ldots c_{x0} * X[n] + c_{x1} * X[n-1] + c_{x2} * X[n-2]$$

where $Y[n-1]$ is the previous output and $Y[n-2]$ is the output prior to $Y[n-1]$, etc. Similarly $X[n]$ is the current input, and $X[n-1]$ is previous input, etc. This operation can be built by the sum of two vector dot products of $c_y * Y + c_x * X$. The dot product is done using a circular vector so new data is written over the oldest data. The pointer is updated to point to the now newest data, and the multiplication always starts with the youngest data entry and (in order) goes through the rest of the data entries. The index pointer to data used in the multiplication will wrap to the physical start of the vector when the end of the vector is complete. After the filter operation the pointer is updated such that the new youngest pointer is now where the oldest data was stored. The need to perform this operation efficiently is one of the motivations for the invention described herein.

SUMMARY OF THE INVENTION

The invention implements selected calculations on digital processing systems such as digital signal processors (DSPs) and the like. One embodiment of the invention implements the task of performing an arithmetic operation such as multiplication or division of a fixed point variable measured at runtime by a floating point constant known at compile-time. The floating point constant is converted into a mantissa and a base-2 exponent at compile-time. The bit size of the mantissa is preferably chosen to facilitate use of fixed point multiplication. The exponent is preferably a 2's complement number. The mantissa and exponent are preferably stored in adjacent locations in memory of the system. For maximum efficiency, the mantissa and exponent are preferably combined into a single unit of memory (a word) that can be loaded into a register by a single instruction or operation. In one embodiment the mantissa becomes half of a single word of memory and the exponent is the other half of the word of memory. Prior to deriving the mantissa-exponent values, the floating point constant can optionally be scaled by dividing by a maximum possible value. The maximum values of the expected runtime variable and the result of the calculation can be used to scale the constant. The result of this scaling is a number less than one which is then used to derive a mantissa and a base-2 exponent at compile-time.

At runtime the multiplication and accumulation is preferably achieved by a microprocessor or DSP instruction designed to use the mantissa-exponent pairs stored in adjacent locations in memory, e.g. as the upper and lower portions of a single word of memory. The instruction multiplies a fixed point runtime variable x by the mantissa and the result is shifted to the right or left as indicated by the signed exponent. The result can be added to an accumulator to make multiple calculations efficient. Because the mantissa and the exponent are placed in memory, the complete instruction sequence to perform the multiplication can be made reentrant.

Iterative calculations are facilitated by storing the multiple values for x in contiguous memory locations and by storing the multiple values for the mantissa-exponent pairs in contiguous memory locations. In one embodiment of the invention a single microprocessor or DSP instruction is used to perform the iterative multiplication and accumulation required for the matrix and vector operations. For example, an instruction can be architected to perform the complete matrix/vector operations using the starting address of the set of mantissa-exponent words, the starting address of the set of input values, and the appropriate counts. The total operations performed at runtime are substantially reduced by the invention in comparison with prior art methods. Pipelining of instructions at runtime is also facilitated by the invention.

DETAILED DESCRIPTION OF THE INVENTION

The first embodiment of the invention that will be described addresses the task of performing an arithmetic operation such as multiplication (or division) of a fixed point number whose value is only known at runtime by a floating point number known at compile-time. This is a common task for microprocessors in embedded systems such as disk drives. The invention simplifies the runtime task of performing the arithmetic operation to one of multiplying an unknown number by a fixed point representation of the known number with a subsequent shift operation that adjusts for the gain difference introduced when the known floating point number was converted to fixed point. Division is the equivalent of multiplying by the reciprocal of the number, so the following description will expressly deal with multiplication.

Figure 1:
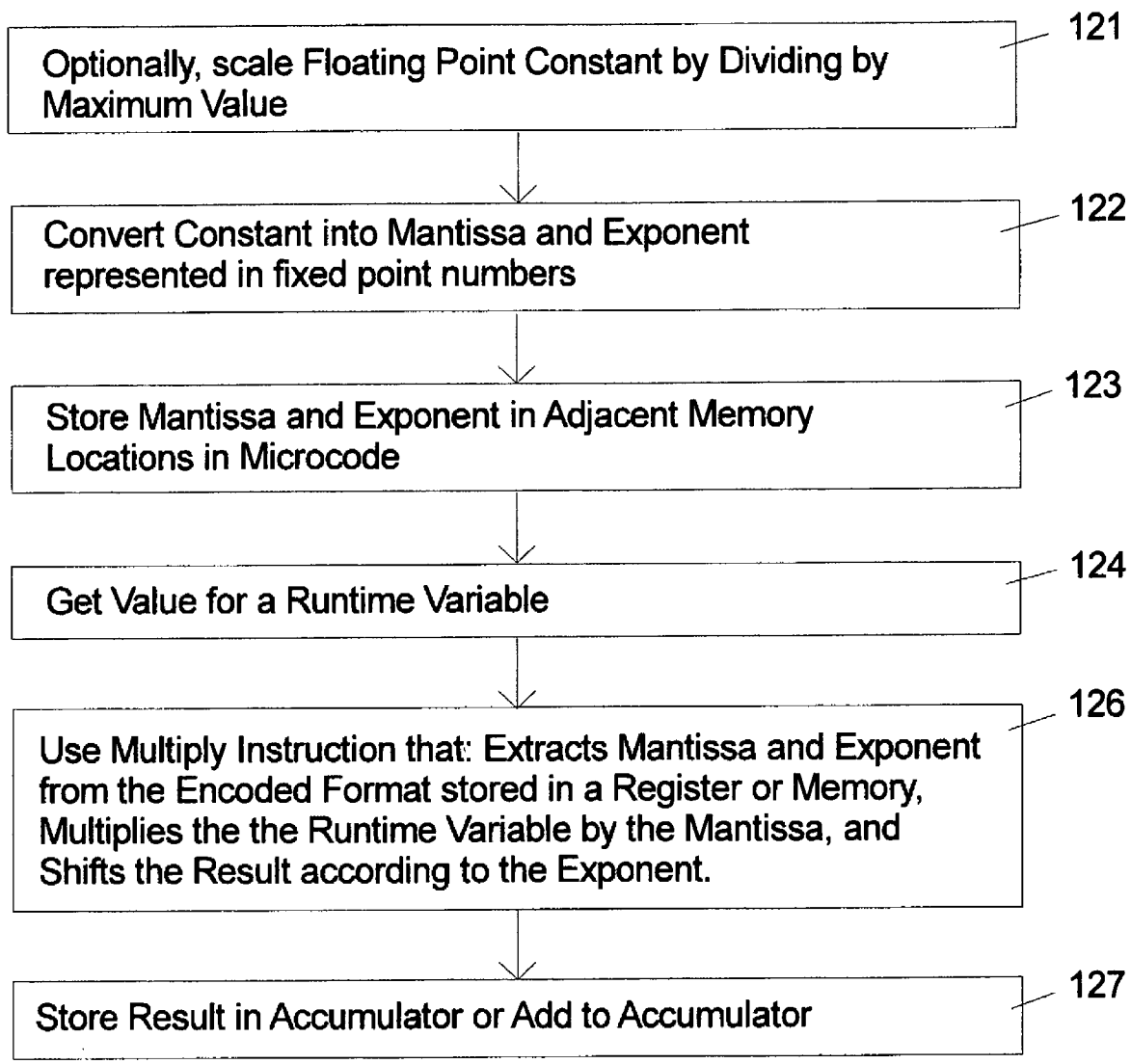
FIG. 1 is a high-level flowchart illustrating a method according to an embodiment of the invention for performing an arithmetic calculation using a floating point constant known at compile-time and a fixed point runtime variable.

FIG. 1 is a flowchart that will be used to illustrate an embodiment of a method of the invention that performs an arithmetic calculation at runtime on fixed point microprocessor hardware to calculate a result such as multiplying or dividing a fixed point runtime variable by a floating point constant that is known at compile time. The method includes actions that take place when the microcode, firmware or software for the device such as a disk drive is created, i.e. compile-time. The term microcode will be used to refer generally to any stored program including executable instructions and data for use by a microprocessor, microcomputer, digital signal processor or the like. Similarly the term microprocessor will be used to refer generically to any processor including microcomputers, digital signal processors or the like.

As shown in FIG. 1 the floating point constant which is known at compile-time is optionally scaled by dividing by a predetermined maximum value 121. The result is by definition less than or equal to one. Either the scaled value or the unscaled value of the constant is then converted into a pair of fixed point numbers that serves as the mantissa and an associated exponent 122. The mantissa and exponent will collectively be called the CTFP_Coefficient. The details of this conversion process will be discussed further below. The values for the mantissa and exponent are stored as constants in the microcode/memory for the device in adjacent memory locations, preferably encoded as a single word 123. The size of retrievable units of memory vary between systems, but for example, the mantissa and exponent might each be 16 bits and be combined into a 32 bit word that can be retrieved from memory in a single instruction cycle. Storing the pair of numbers as a single word allows efficiencies to be achieved at runtime as will be described below. The preceding actions all take place when the microcode is prepared, i.e. at compile-time. Microcode is typically written and compiled on development computer system such as a desktop computer. The executable code can be burned into nonvolatile memory which is installed into the device, stored on the disk, etc. The microcode can also be downloaded to the device by standard communication means. The subsequent actions take place inside the device when it is operating.

The value of the runtime variable only becomes known when the device is operating, so the value of the runtime variable is either read directly from sensors or derived from data read from sensors 124. The runtime variable is optionally scaled by shifting left by one less than the number of bits in the runtime variable and dividing by the predetermined maximum value (not shown). The left shift is the equivalent of multiplying by a power of two equal to the number of bit positions not including the sign bit, i.e. multiplying by exp2 (N−1) where N is the number of bits available to represent x. This operation can be conveniently performed if the register or accumulator has more available bits than are used for the runtime variable x. For example, if a maximum of 16 bits are used for the runtime variable, then an accumulator with 32 or more bits can be used for this conversion. This scaling operation introduces two factors (values) into the calculation that aid in using fixed point processor instructions to achieve the equivalent of a floating point calculation.

An embodiment of the invention uses a specially designed hardware instruction to perform the multiplication and shift operation. The complete set of actions required to retrieve the mantissa and exponent and load the runtime variable, etc. can be divided up into several instructions according to well known principles of microprocessor and/or DSP instruction design. For example, instructions can be architected to accept memory addresses for parameters such as the runtime variable and/or the mantissa and exponent pair. In this case the instruction will fetch the data from memory. The addresses for inputs and/or outputs can be loaded into index registers. Alternatively one or more parameters or date values can be loaded into registers by a MOVE or LOAD instruction first, then the multiplication instruction can be told which registers to use, or if only one register is allowed, then it does not need to be specified. Combinations of registers and memory addresses can be used as well. Therefore, through one or more instructions the mantissa-exponent word is loaded from memory, and the runtime variable is then multiplied by the mantissa. Since both of these numbers are fixed point, this is a fixed point operation. The result of the operation is then shifted by the number of bits indicated by the exponent, which is preferably a signed 2's complement value. The multiply and shift operations are preferably accomplished by a single instruction 126. The result can be stored in the accumulator or added to the accumulator in case of pipeline filter or vector dot product as will be described below 127.

The process is equivalent to the equation:

$$\text{result} = [(\text{mantissa} * \text{variable})/\exp2(\text{exponent})]/\exp2(P-1)$$

where P is the number of extra bits in the accumulator beyond what will be stored in memory. For example, P will be 16 for the case of a 48-bit accumulator and 32-bit memory word size. If mantissa*variable is 16 bits*32 bits, the result is a 48 bit number. The division by $2^{P-1}$ removes the bottom 16 bits to result into a 32 bit number again. The lower 16 bit portion of a 48 bit accumulator can be carried for subsequent operations added to (or subtracted from) the accumulator which adds detail to the summation. In this example, the final result will be stored as a 32 bit number representing the highest order 32 bits of the accumulator.

If the optional scaling of the runtime variable x was performed, the scaled result has been multiplied by a factor of $2^{P-1}$ and divided by the fullscale value of x. The realtime system does not typically scale the numbers except when forming them for use in the fixed point processor. But the runtime variable can be scaled for human readability by dividing by $2^{\wedge}(M-1)$ and then multiplying by the fullscale in order to facilitate understanding of the runtime data.

A practical implementation representing floating numbers by integers (binary values) allocates some of the total number of available bits to represent the portion of the number to the right of the decimal point. The more bits that are allocated to the decimal portion of the number, the lower the largest number that can be represented. The invention can use any combination of bit sizes to fit the multiplier, but 16 bit numbers will be used in the examples for simplicity unless otherwise noted. The following example assumes that 16 bits in total are available for representing the mantissa as a 2's compliment number. If one bit is allocated for the fractional portion to the right of the decimal place, then there are 14 bits for the representing the value to the left of the decimal point and one sign bit. Therefore, in this example the largest positive number that can be represented is 16383.5 which is 0x7FFF. The hexadecimal number 0x8000=−16384 and 0x8001 is then −16383.5. As a simple example to illustrate the principle, the floating point number 1.5 can be represented as 3/2 which can be further represented as a mantissa of 3 and an base-2 exponent of −1. The number 1.5 can be represented perfectly in this example by mantissa 3 which is the equivalent of 3/2. However, using only one bit for the fractional portion limits the precision and can introduce unacceptable errors. An another example using the method of the invention pi (3.141592654 . . . ) can be represented with approximately 0.0002% error as:

round(3.141592654/4*$2^{15}$)= round(25735.92702)=25736 or 0x6488/$2^{-13}$ represents 3.141601563

The precision and, therefore, the error in converting floating point numbers to fixed point numbers with a finite number of bits is a design tradeoff between how many total bits are used to represent the number and the number of bits required to represent the number. When very large numbers also need to distinguish very small differences, more total bits in the number may be needed such as increasing from 16 bit to 32 bit numbers.

The method of the invention allows the mantissa to be as big as the available number of bits (e.g. 16 bits) will allow. The effect is to increase the precision while representing the number in a small number of bits. A CTFP_Coefficient will be defined as a pair of 2's compliment numbers consisting of a CTFP_exponent and CTFP_mantissa. Therefore:

floating_point#=CTFP_mantissa/exp2($M$–1)/exp2 (CTFP_exponent)

where M=the number of bits available for the mantissa and N=the number of bits available for the pair.

In the examples below M=16 and N=32. The number of bits available for the exponent in the examples is therefore, 16. This would allow a range of 32768 . . . –32768 for the exponent. However, exponent values that are larger than the number of bits in the accumulator in the actual processor are not used in practice. It is typical for the exponent to have a much smaller range than the mantissa and, therefore, it can be represented in fewer bits. For example, in a system with a 48-bit accumulator, only those bit values that produce a meaningful, nonzero result, are used. Thus, there may be "don't-care-bits" in the word in which the exponent is stored, or the mantissa could include the "don't-care-bits."

Figure 2:
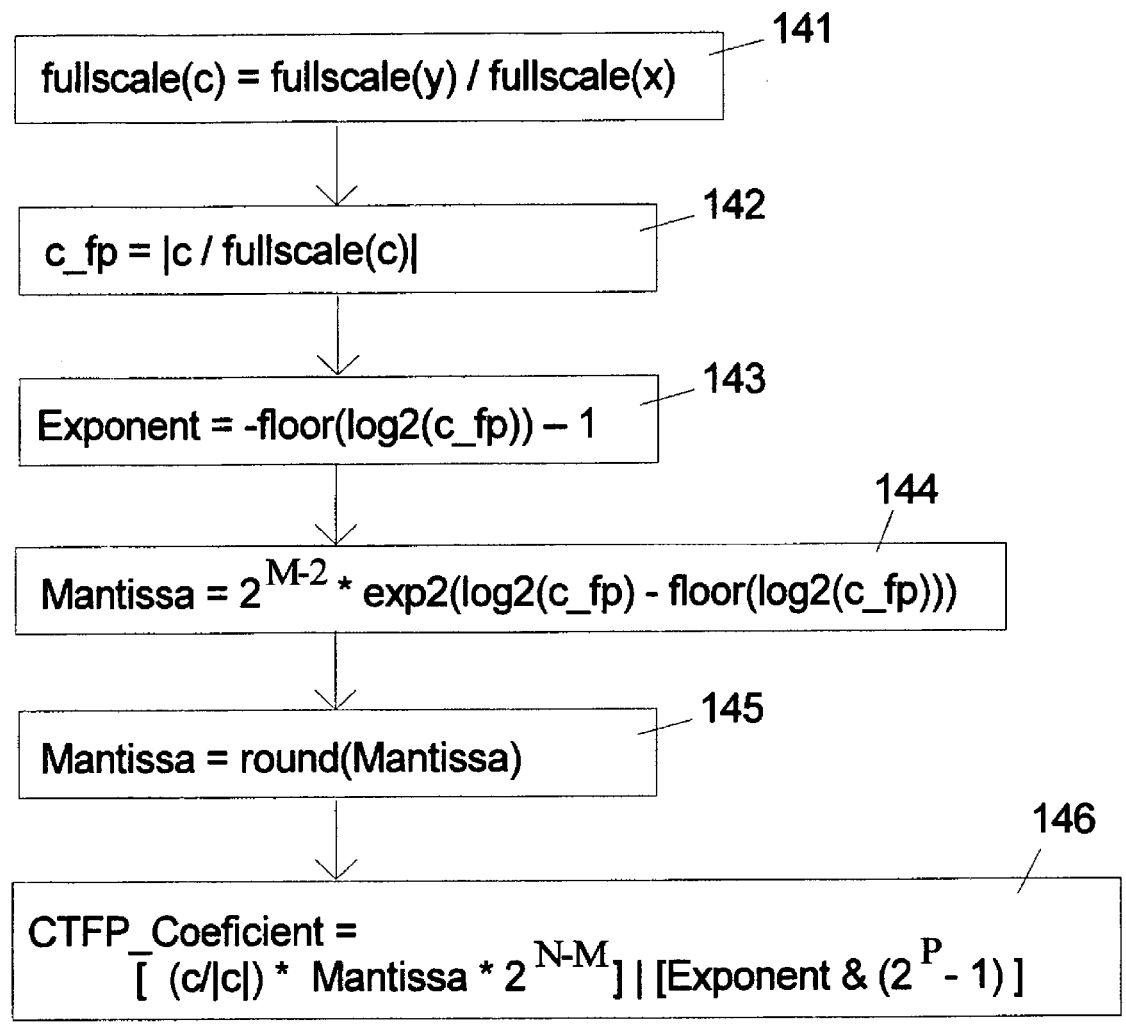
FIG. 2 is a flowchart illustrating a method of converting a floating point constant into a scaled mantissa and exponent represented in fixed point numbers at compile-time according to an embodiment of the invention.

An embodiment of the method according to the invention that includes scaling will be described with reference to the flowchart in FIG. 2 which illustrates the compile-time process of deriving the pair of numbers for the CTFP_Coefficient. "P" is the number of bits allowed for the 2's complement exponent.

The runtime variable is "x". The floating point constant is "c". The result of c*x is y. Log 2 will be used to mean "log base-2." The predetermined maximum value of a parameter is represented as "fullscale( )."
With standard multiplication operations the equations would be:

fullscale($y$)=2*fullscale($c$)*fullscale($x$)

fullscale($c$)=fullscale($y$)/fullscale($x$)/2 fullscale($x$)=fullscale($y$)/fullscale($c$)/2

However, typical digital signal processors (DSPs) use a special multiply mode (fractional multiply), which shift the results to the left by one bit to remove a redundant sign bit that is created by the multiplication. For example, the normal multiply of 0.9*0.9 would yield the result 0.45 because the sign bits force one more bit to be present next to the sign bit than is required or desired in DSPs. This shift allows 0.9*0.9 to equal 0.81. Therefore, assuming the use of the fractional multiply, the fullscale equations are:

fullscale($y$)=fullscale($c$)*fullscale($x$)

fullscale($c$)=fullscale($y$)/fullscale($x$)

fullscale($x$)=fullscale($y$)/fullscale($c$)

The values for fullscale(x) and fullscale(y) will be known at compile-time based on the particular application. For example, x might be a voltage with a known range of values. Fullscale(c) may also be known obviating the need for any calculation. If necessary the embodiment of the method shown in FIG. 2 calculates fullscale(c) as:

fullscale($c$)=fullscale ($y$)/fullscale ($x$)     141

The value of c is then optionally normalized by dividing by fullscale(c):

$c\_fp$=|$c$/fullscale($c$)|     142

The method will work without the scaling in 142, so it is optional although preferable.

Continuing with the example, the exponent and mantissa are then calculated as:

Exponent=–floor(log 2($c\_fp$))     143

Mantissa=exp2($M$–2)*exp2(log 2($c\_fp$)–floor(log 2($c\_fp$)))     144

Mantissa=round(Mantissa)     145

The complete CTFP_Coefficient pair is then preferably built into a single word by performing logical bit operations with the two components:

CTFP_Coefficient=[($c$/|$c$|)*Mantissa*exp2($N$–$M$)]| [Exponent & (exp2($P$)–1)]     146 where "|" represents a binary "OR" operation; and "&" represents a binary "AND" operation.

A numerical example without scaling will be described to illustrate a principle used in the compile-time conversion process. Assume that the runtime task is to multiply a 32-bit number V (whose value only becomes known at runtime from sensor measurements) by a floating point constant that is known at compile-time to be 45.96. For the moment scaling the numbers will be omitted. In this simplified example 45.96 can be transformed into a coefficient pair (mantissa, exponent) or (0x5BEC, –6) at compile time. The value 0x5BEC (i.e. 23,532) is the equivalent of multiplying 45.96 by $2^9$. The exponent of –6 is the multiplier of $2^9$ minus the number of significant bits (i.e. 15) not including the sign bit. So 45.96=0x5BEC/$2^{15}$/$2^{-6}$ within the quantization limits. The mantissa is a 16 bit number, so the $2^{15}$ factor comes from the fact that 16 bits*32 bits yields 48 bit answer. Using the fractional multiplier and using the resulting "top" highest significant 32 bits for the result yields the result of fractional multiply/$2^{16}$. See above discussion on fractional multiply operations.

The operations at runtime then cause V to multiplied by 0x5BEC followed by a left shift of 6 bits as part of the instruction sequence which implements the multiplication by $2^6$. The result is V*45.96 within the quantization limits.

To further illustrate the principles a numerical example with scaling will be described. The assumed problem is to multiply x=26.0 amps by c=0.73125 volts/amp for result y in volts. The value of 26.0 amps would be measured at runtime. The method will work with any value of x within the fullscale. The value of c would be known at compile-time from the characteristics of the equipment being used. Thirty-two bits are used for x, y and c, but M=16 bits. The reference numbers refer to the steps in FIG. 2:

fullscale($y$)=150.72 Volts [assumed]

fullscale($x$)=56.97 Amps [assumed]

$c$=0.73125 Volts/Amp [assumed]

fullscale(c)=(150.72 Volts)/(56.97 Amps)=2.6456  (141)

c_fp=0.73125/(2.6456)=0.276402  (142)

Note: log 2(c_fp)=−1.85516

Exponent=−floor(−1.85516)−1=−(−2)−1=1 or 0x0001  (143)

Mantissa=$2^{14}*2^{(-1.85516-(-2))}$  (144)

which becomes:

Mantissa=16384.0*exp2(−1.85516−
(−2))=18114=0x46C2  (144)

Mantissa=round(Mantissa)=18114=0x46C2  (145)

CTFP_Coefficient=1*0x46C2*exp2(32−
16)]|[0x0001 & (exp2(32−16)−1)]  (146)

which becomes:

CTFP_Coefficient=0x46C20001  (146)

Thus, the floating point number c=0.73125 has been transformed at compile-time into a 16-bit mantissa (0x46C2) and a 16-bit exponent (0x0001) which are combined into a single 32 bit number 0x46C20001 representing the scaled value of c=0.276397705. Using the decimal equivalent of 0x46C2 which is 18114:

18114/exp2(15+1)=0.276397705

Note that this value is not exactly equal to desired 0.276402, but it is sufficiently close for most applications.

The numerical example from above will now be continued for the runtime process. In the example where x has been read at runtime as 26.0, N=32 and the fullscale value of x is 56.97, the scaled value of x is therefore:

x_scaled=26.0/56.97*exp2(31)=980069771 or
0x3A6AAD8B.

From the compile-time calculation above for c:

CTFP_mantissa=18114

The result of the operation in 126 in FIG. 1 is, therefore, to multiply the CTFP_mantissa by the scaled value of x:

accumulator→18114*980069771

The result of the shift operation is then to divide the result in the accumulator by exp2(M−1+CTFP_exponent) which with M=16 and the CTFP_exponent=1 is accomplished by shifting the contents of the accumulator 16 bit positions to the right:

shift right 16 bit positions→270889035 or
0x1025704B

This result can be checked using the fullscale(y) value of 150.72 by computing:

(270889035/exp2(31))*150.72=19.0122 volts which is sufficiently close to the exact answer of 26.0*0.73125=19.0125. The reason to divide by exp2(31) is to obtain a ratio less than 1.0 using 32 bit 2's compliment number. Thus, 0x80000000 is representative of −1 or (0x80000000/$2^{31}$). This ratio is the fraction of the fullscale that the number represents.

The processor usage at run-time for simple multiplication is illustrated as follows for Y=ctfp*X:
    Load CTFP_register with CTFP(exponent, mantissa) pair
    Multiply CTFP_mantissa by X, store result in product_register
    Shift product_register by CTFP_exponent (negative is left shift and positive exponent is right shift, for example), then store in accumulator (or optionally add to accumulator)
    Accumulator now contains ctfp*X
    Store accumulator in Y
For comparison using a generic fixed point processor and a prior art method the runtime instructions might include:
    Load register1 with 0x46c2
    Mpy reg1, x
    Shiftright prodreg, 1
    Store prodreg, y
Note that the prior art could generate the same mantissa value of 0x46c2 for the constant. The amount and direction of the shift in this prior art example is hard-coded in the microcode as a shift-right by one bit. This means that for each unique constant, unique code is required. There is also additional processor overhead for fetching and execution of additional instructions for the shift portion of the operation. Thus, the prior art code is inherently non-reentrant.

However, in an embodiment of the present invention the microprocessor is designed to perform an instruction that executes a method according to the invention more efficiently than can be achieved using standard instructions such as shift and multiply. The first version of this instruction, which will be arbitrarily called "CMPY," uses the mantissa and the exponent in the single word format generated as described above. An additional instruction might be created to load the coefficient pair from memory into appropriate registers. The instruction to load the register(s) will be called "MOVCW." Its parameter is a memory address where the CTFP_coefficient pair is stored. If the instruction design includes multiple registers where the CTFP_coefficient pair can be stored, then the particular register(s) should be a parameter as well. The register will be called the "CREG" in the examples below.

The CMPY instruction performs the multiply, shift and accumulate operations. Parameters for the instruction include the address of the variable that will be multiplied. If multiple registers are allowed for the CTFP_coefficient pair, then the register must be specified. The art of microprocessor design includes standard variations such as using registers to contain parameters, direct addressing of memory and placing addresses of parameter in registers and so forth, so the examples herein should not be taken to be exclusive ways that instructions implementing the invention can be architected.

Figures 4, 5:
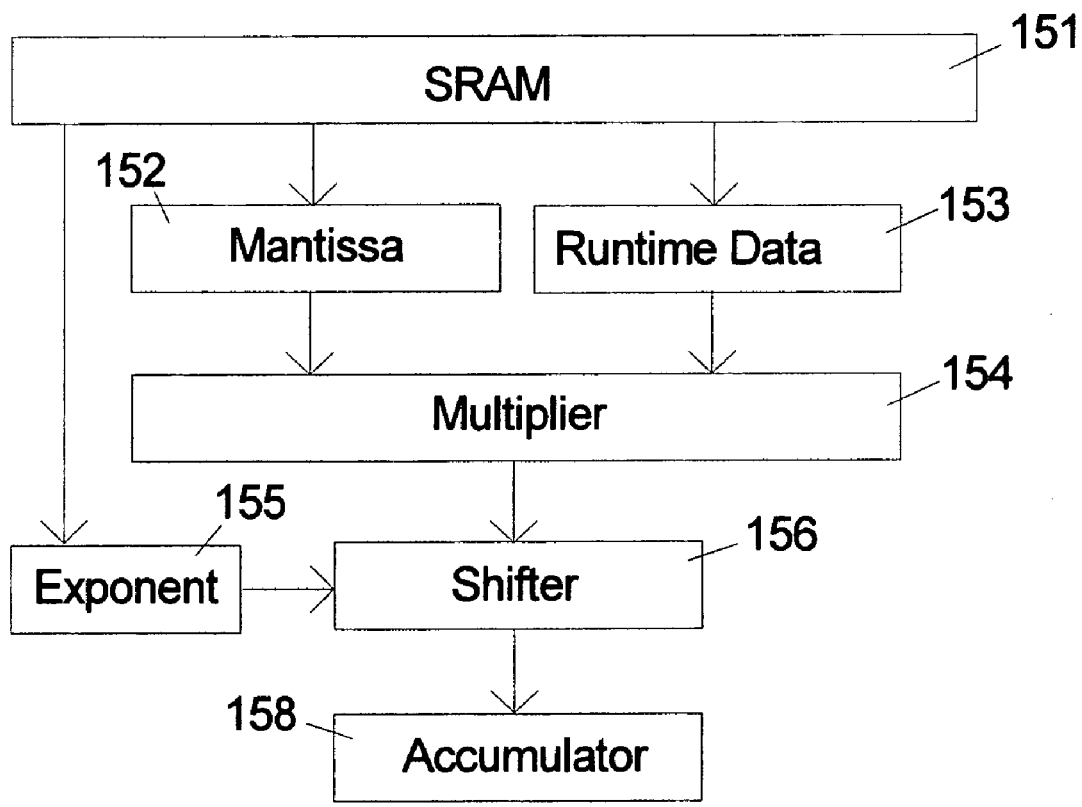
FIG. 4 is an illustration of the way data used by the invention is stored in memory in an embodiment of the invention.
FIG. 5 is a block diagram illustrating the functional components in a microprocessor implementing a multiply instruction according to an embodiment of the invention that stores the result in the accumulator.

In embodiments where multiple calculations have to be performed, an efficient use of these instructions includes organizing the needed mantissa-exponent pairs in contiguous memory so that multiple operations can be performed by incrementing the memory address to point to the next mantissa-exponent pair and the next data value. FIG. 4 illustrates the storage of the coefficient pairs 0 . . . n in contiguous memory. The runtime data values 0 . . . N are also stored contiguously. The embodiment of the method described above generates the data for storage with the high order portion being the mantissa and the low order portion is the exponent. In some microprocessor architectures the low order byte of a 16 bit word is stored before the high order byte, so the actual mapping of the portions of the word to memory addresses may vary.

FIG. 5 is a block diagram illustrating the functional components in a microprocessor or DSP system implementing a multiply instruction (which will be referred to as "CMPY") according to an embodiment of the invention. The system has a general purpose memory such as SRAM 151 containing the required data. In one embodiment a "MOVCW" instruction loads the CTFP_coefficient pair from SRAM into internal memory in the processor such as one or more registers for subsequent use by the CMPY instruction. The system distinguishes/separates the mantissa component 152 and the exponent component 155. The mantissa 152 and exponent 155 are preferably retrieved from memory as a single word, so the instructions only need a single address in order to load both values.

The CMPY instruction also uses the runtime data value 153. The address in memory where the runtime data value 153 is stored can be provided as a parameter for the instruction so that the CMPY instruction can load the value into a register. The Multiplier 154 multiplies the mantissa and the runtime data variable. The result of the multiplication is shifted by the Shifter 156 using the exponent 155 as previously described to shift either right or left based on the 2's complement value of the exponent. This result is then stored in Accumulator 158.

An example of a pseudocode instruction sequence for a single multiplication is as follows. The prefix "//" designates comments.

```
// define data area for coefficient CTFP_coef at compile time with
// exponent "1", mantissa "0x46c2" pair of 16 bit numbers
Coeff( CTFP_coef, 0x46c20001);
// define area for runtime data variables at compile time
Data( data_x, 0);        // Symbolic label "data_x" for input variable
                            storage
Data( result, 0);        // Symbolic label "result" for output variable
                            storage
// MOVCW loads the mantissa-exponent word from a memory address
// into the CTFP_register that is usable by the subsequent CMPY multiply
// instruction
MOVCW CREG, CTFP_coef    // data in CTFP_coef is
                         // 0x46c20001
// The CMPY instruction below loads the data at the symbolic memory
// location "data_x" into data register, then
// multiplies the data by the mantissa which is the upper portion of the
// CREG. The result is shifted by the exponent which is the lower portion
// of the CREG and then stored in the accumulator
CMPY CREG, data_x
// The result is then stored in a memory location
Store accumulator, result
```

The CMPY instruction allows the procedure to be reentrant, i.e., usable by multiple callers with different data for the input "data_x". The memory locations for the input & output data are preferably indexed using standard techniques including the use of page registers. A significant difference even with this simple example over the prior art is that the parameter for the shift operation is efficiently built into the data in memory. By referencing memory rather than hardcoded values in the microcode instructions, this embodiment of the invention creates a reentrant procedure.

The example above is only one of many possible ways that instructions implementing the invention can be architected. Another variation uses a default register for the working register, which allows the reference to a register to be omitted. The MOVCW instruction in this case only needs the address of the memory location for the mantissa-exponent. In another variation the CMPY could be architected to accept two memory addresses (one for the mantissa-exponent pair and one for the input variable) and thereby remove the need for the separate MOV instruction. Other variations will be readily apparent to those skilled in the art of microprocessor instruction design.

Figure 6:
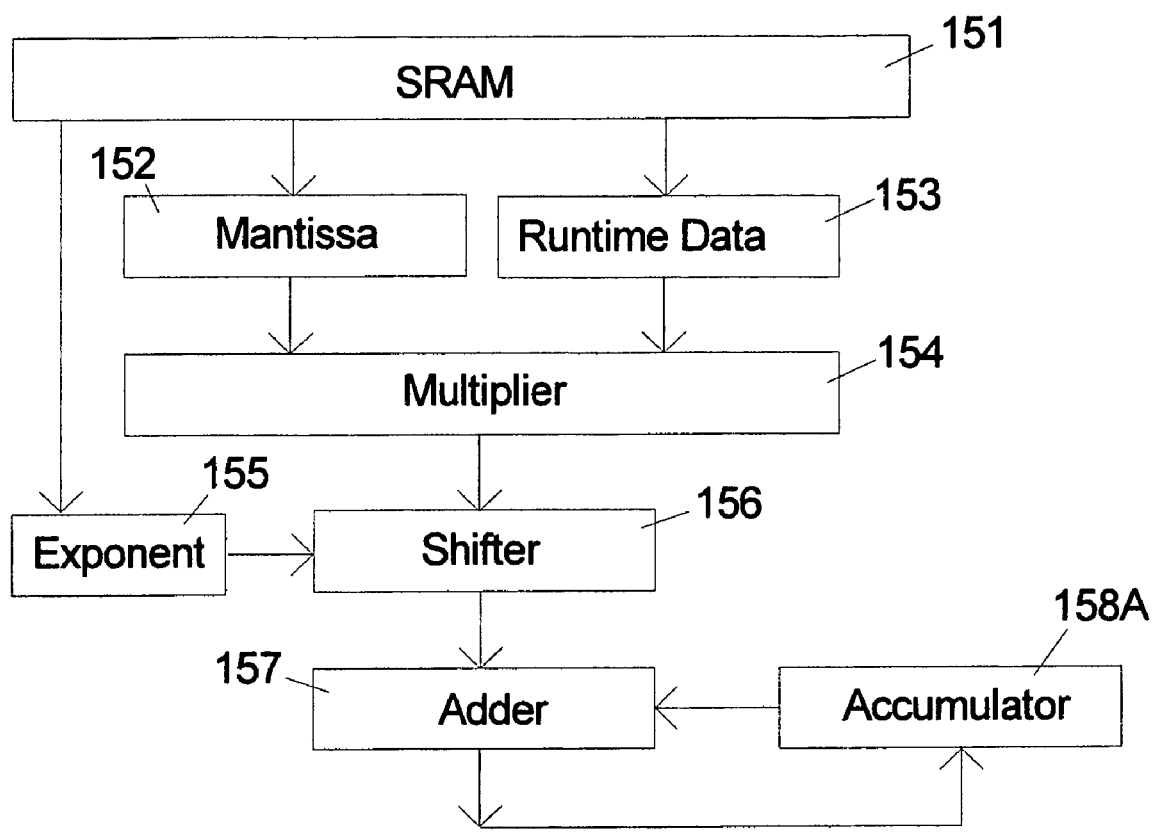
FIG. 6 is a block diagram illustrating the functional components in a microprocessor implementing a multiply instruction according to an embodiment of the invention that adds the result to the running total in the accumulator.

In most applications, preferably an instruction will also be included that adds the result to the running total in the accumulator as is done in standard multiply and accumulate instructions. FIG. 6 is a block diagram illustrating the functional components in a microprocessor implementing a multiply instruction (which will referred to as "MAC_CMPY") according to an embodiment of the invention. The MAC_CMPY instruction uses Adder 157 to add the result to the previous total in Accumulator 158A, but is otherwise similar to CMPY.

In coefficient matrix multiplication and filter instructions in an embodiment of the method of the invention, the shift can be "hidden" by pipeline operation and effective single cycle compile time floating point per tap or node can be realized. Since the data contains the exponent, the matrix multiply instruction can make use of standard pipelining of multiply and shift to approach one cycle potential for each coefficient/data pair. The larger the matrix the better the efficiency.

For the matrix equation an example of a simple case is provided. Where T indicates a 1×N matrix transpose to N×1:

$$\text{Given } y = [c1\ c2\ \ldots\ ]^*[x1\ x2\ x3\ \ldots\ ]T \text{ or}$$

$$y = c1^*x1 + c2^*x2 + c3^*x3\ \ldots,$$

All fullscales and units must be equal if they are added to or subtracted from each other. Where fs(y) means fullscale of y:

$$fs(y) = fs(c1)^*fs(x1), \text{ and}$$

$$fs(y) = fs(c2)^*fs(x2), \text{ and}$$

$$fs(y) = fs(c3)^*fs(x2)$$

Example: $fs(y)=58.92, fs(x1)=67.0, fs(x2)=31.0, fs(x2)=1.0$

→$fs(c1)=58.92/67.0=0.879402985$, and

→$fs(c2)=58.92/31.0=1.900645161$, and

→$fs(c3)=58.92/1.0=58.92$

In this example $fs(y)=fs(c1)^*fs(x1)$ →$58.92=0.879402985^*67.0$.

An example of a simple matrix multiply, 1×2*2×1=1×1 is:

$$Y = [c1\ c2\ ] \times [X1\ X2]T \text{ or}$$

$$Y = c1^*X1 + c2^*X2$$

$fs(Y)=10.0, fs(X1)=5.0, fs(X2)=3.0$ as follows:

$fs(\text{ctfp1})=fs(Y)/fs(X1)=2.0$ and $fs(\text{ctfp2})=fs(Y)/fs(X2)=3.3333333333$ $X1=2.5, X2=2.5, c1=0.1, c2=-3.5$ $\text{ctfp}_1=0.1/2.0=0.05, \text{ctfp2}=-3.5/3.3333333333=-1.05$ $\text{ctfp}_{1\ exp}=-\text{floor}(\log 2)(0.05)-1=-\text{floor}(-4.3219)-1=-(-5)-1=4$ $\text{ctfp}_{1\ mant}=\exp2(-4.3219-(-5))^*2^{14}=26214$ or $0x6666$ $\text{ctfp}_{2\ exp}=-\text{floor}(\log 2(|-1.05|))-1=-\text{floor}(0.070389)-1=-(-0)-1=-1$ $\text{ctfp}_{2\ mant}=-\exp2(0.070389-0.0)^*2^{14}=-17203$ or $0xBCCD$ $X1=2.5→2.5/5.0=0.5^*2^{31}=1073741824$ or $0x40000000$ $X2=2.5→2.5/3.0=0.8333333333^*2^{31}=1789569707$ or $0x6AAAAAAA$ $Y=(26214^*1073741824/2^4-17203^*1789569707/2^{-1})/2^{16-1}=-1825340075$ or $0x93338555$ $Y=-1825340075/2^{31}*10.0=-8.4999$ (Checking the result→$0.1^*2.5-3.5^*2.5=-8.5$.)

The processor usage at run-time for simple matrix multiplication (e.g., 1×2*2×1=1×1) for $Y=$[ctfp1 ctfp2]×[X1 X2]T or $Y=$ctfp1*X1+ctfp2*X2 is:
Load CTFP_register with ctfp1 (exponent, mantissa) pair
Multiply CTFP_mantissa by X1, store in product_register
Shift product by exponent (negative is left shift and positive exponent is right shift for example), store in accumulator
Now accumulator contains ctfp1*X1
Load CTFP register with ctfp2 (exponent, mantissa) pair
Multiply CTFP mantissa by X2, store in product register
Shift product register by exponent (negative is left shift and positive exponent is right shift, for example), add to accumulator. Now accumulator contains ctfp1*X1+ctfp2*X2.
Store accumulator in Y The method of the invention is conducive to efficiencies gained by the operations at runtime when multiple calculations are to be performed. The invention allows loading the CTFP representation of number for the next multiplication operation in the same cycle that the product is being accumulated into the accumulator. Off-the-shelf processors have pipelining capability for multiply and accumulate operations to be performed in a single clock cycle after the pipeline is "loaded." The invention here facilitates the ability to overlap instructions in a pipeline with the shift portion of the CTFP multiplication operation. The filter instructions described in published US patent application 20060195498 by Dobbek, et al. can be used effectively with the present invention to obtain nearly the benefit of single cycle per tap.

For the looping through the matrix operations address indexing can be accomplished in various ways known in the prior art. The address for the mantissa-exponents, runtime input variables and output area can be referenced by index registers that are appropriately incremented in each loop. Loop counts can be provided as parameters. Although the addresses might be incremented by separate Instructions, the address incrementing can also be architected into instructions. For example, a MAC_CMPY type instruction can be designed that automatically increments addresses and decrements counts in various registers to facilitate efficient looping and pipelining. Many variations of instructions and parameters can be used by those skilled in the art to achieve the desired result.

Figure 3:
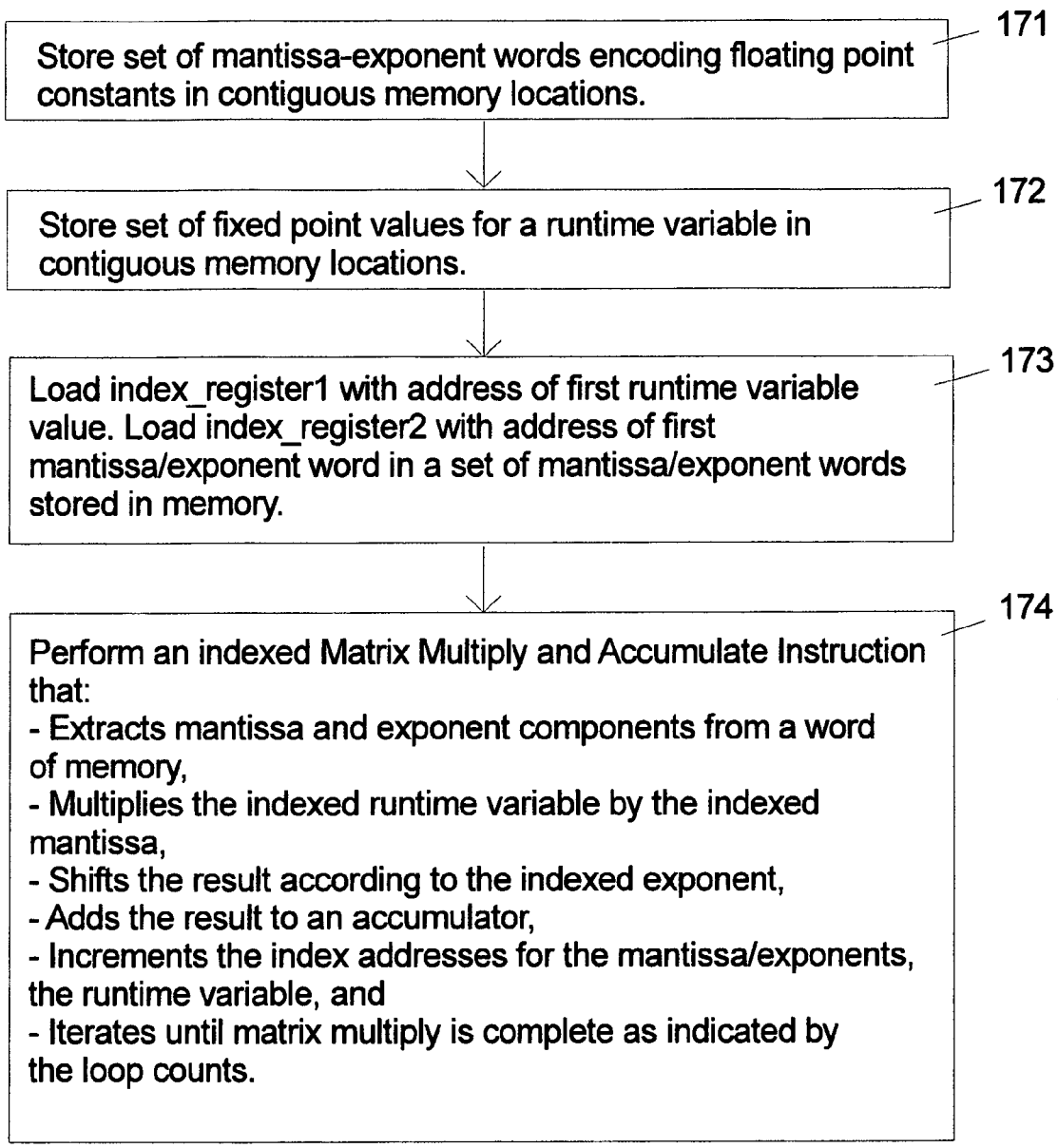
FIG. 3 is a flowchart illustrating a method of matrix multiplication according to an embodiment of the invention.

FIG. 3 is a flowchart illustrating a method of matrix multiplication according to an embodiment of the invention. The predetermined set mantissa-exponent pairs/words have been stored in contiguous locations in memory 171. The set of runtime variable values are also stored in contiguous memory locations to facilitate rapid processing 172. In this embodiment index registers are used to contain the addresses of the inputs. Thus, a first index register ("index_register1") is loaded with address of first runtime variable value in a set of values in memory. "Index_register2" is loaded with the address of first mantissa-exponent word in a set of mantissa-exponent words stored in memory 173. A single instruction is used to command the DSP to perform the matrix multiplication 174. The instruction is architected to extract the mantissa and exponent components from a word of memory pointed to by index_register2, multiply the runtime variable pointed to by index_register1 by the extracted mantissa, shift the result according to the extracted exponent, and add the result to an accumulator. The instruction iterates by incrementing the index registers to point to the next locations in memory for the next calculation. The instruction iterates for each row, and the loop count is reset to be the column count of the coefficient matrix. The accumulator is reset to 0, and the index_register1 is reset to the address of the first runtime variable. But note that index_register2, which points to the mantissa-exponent words is not reset for each row.

In a matrix of the processor usage at runtime for a 4-phase pipelined 2×3 matrix according to the invention, the actions in a column occur in parallel. It is a 2×3*a 3×1 resulting in a 2×1 vector, so the same 3 inputs are used twice—once for each row of the CTFP matrix. The sequence begins with loading the first CTFP_Coefficient pair/word into a register. In column two the second CTFP_Coefficient pair/word is loaded into another register while the multiplication using the first mantissa is being performed. The pipelining capability of the particular processor limits the number of operations that can be performed in parallel.

The following is an example of the phi matrix described in the state space example for modeling a mechanical system. Below is the digitized version of the state space phi*X portion of a voice coil motor with a low pass power amp. The physical description of the numbers is not important and will be omitted. The requirement is to multiply a coefficient matrix with the label "Coeff" by a state vector In previously stored in memory to get the result.

```
// float f_coeff[ ] = {1.0, 3.604e-4, 3.1399e-4, 4.9748e-5
// 0.0, 1.0, 0.13919, 0.27603,
// 0.0, 0.0, 0.0, 0.13919,
// 0.0, 0.0, 0.0, 1.0};
// CTFP matrix assigned the label "Coeff" with 0s omitted since example
processor has an upper triangular multiply instruction Cumxn.
BlockCoeff(Coeff, -1, 16384, 11, 24189, 14, 16857, 14, 26708, -1,
    16384, 2, 18244, 1, 18090, 0,0, 2, 18244, 0, 16384);
Ldadr( ax, out);       // set index register with address of output SRam
Cumxn ( ax,4,4,Coeff,In);        // CTFP 4×4 * 4×1 upper triangular
                                    multiply
```

This example includes only two instructions to the processor, but all of the scaling and shifting is contained in the CTFP data that is labeled "Coeff."

In the example above there is a gain in precision with high dynamic range of 4+ orders of magnitude and far fewer processor cycles are used as well. To illustrate this, the following is the same example of numbers only using fixed point numbers:

```
BlockCoeff(Coeff, 0x7FFF, 12, 8, 2, 0x7FFF, 4561, 9045, 0,
    4561, 0x7FFF);
Ldadr( ax, out);       // set index register with address of output
                          //SRAM
Umxn ( ax,4,4,Coeff,In);     // fixed point 4×4 * 4×1 upper
                                // triangular multiply
```

Note that Coeff [1,4] has only 2 bits to describe the same number. This works out to be a possible 50% error. The difference between potential errors between CTFP and fixed point is $2^{15-1}$ or 16384. This says that the CTFP number can be over 4 orders of magnitude more accurate.

The method of the invention is not limited to, but can be used for

Scalar equations:

$Y=$coeff*X, where x and y are variables

Matrix/Vector/Matrix equations: For example, for a 2×3 matrix*3×1 matrix yielding a 2×1 matrix:

$Y(2\times1)=\text{coeff}(2\times3)*X(3\times1)$, $Y$ and $X$ are vector and coeff is a matrix $fs(\text{coeff }[0,0])=fs(Y[0,0])/fs(X[0,0])$, and $fs(\text{coeff }[0,1])=fs(Y[0,0])/fs(X[1,0])$, ..., $fs(\text{coeff }[y,x])=fs(Y[y,0])/fs(X[x,0])$, ..., Filter structures:

$Y=\text{coeff\_1}*X[n]+\text{coeff\_2}*X[n-1]\ldots \text{coeff\_N}*X[n-N-1]$, where X is history list of X_in and all have fs=fs(X_in)

$fs(\text{coeff\_1})=fs(\text{coeff\_2})=\ldots,fs(\text{coeff\_N})=fs(y)/fs(X\_\text{in})$ Polynomial Structure→X is input and Y is output, ex: Y=3X2−2X+5

$Y=a\_n*Xn+a\_nm1*X(n-1)\ldots a\_0*X0$ $fs(a\_0)=fs(Y)$ $fs(a\_nm1)=fs(Y)/fs(X)(n-1)$ $fs(a\_n)=fs(Y)/fs(X)n$ The invention has been described with reference to specific embodiments, but one of ordinary skill in the art will readily recognize variations to the embodiments and those variations are within the spirit and scope of the present invention.

The invention claimed is:

1. A method of operating a digital processing system having only fixed point arithmetic hardware to multiply a fixed point number whose value is only known at runtime by a floating point constant known at compile-time comprising:
   loading a first fixed point mantissa and a first fixed point exponent from memory into a fixed point processor, the first fixed point mantissa and the first fixed point exponent representing a first floating point constant that was converted at compile-time into the first fixed point mantissa and the first fixed point exponent;
   multiplying the first fixed point mantissa by a first fixed point value for a runtime variable to calculate a first intermediate number using fixed point processor instructions; and
   shifting bits of the first intermediate number to the left or right based on the value of the first fixed point exponent to obtain a first result.

2. The method of claim 1 further comprising:
   placing the first result in an accumulator;
   loading a second mantissa and a second exponent derived from a second floating point constant from memory adjacent to the first fixed point mantissa and first fixed point exponent;
   multiplying the second mantissa by a second fixed point data value to generate a second result;
   shifting bits in the second result right or left based on the second exponent; and
   adding the second result to the first result in the accumulator.

3. The method of claim 1 wherein the first fixed point mantissa and first fixed point exponent are stored in a word of memory and the loading step is performed by a single instruction that loads a word of memory into a fixed point register.

4. The method of claim 1 wherein the first fixed point exponent is stored in 2's complement form and shifting bits of the first intermediate number further comprises shifting in a first direction for positive values of the first fixed point exponent and shifting in a second direction for negative values of the first fixed point exponent.

5. The method of claim 1 further comprising deriving the first fixed point mantissa by a process that includes scaling by dividing the floating point constant by a selected maximum value.

6. The method of claim 1 further comprising placing the first result in an accumulator; and wherein the loading, multiplying, shifting and placing steps comprise a first instruction sequence and the method further comprises a second instruction sequence comprising loading a second mantissa and a second exponent derived from a second floating point constant from memory adjacent to the first fixed point mantissa and first fixed point exponent; multiplying the second mantissa by a second fixed point data value to generate a second result; shifting bits in the second result right or left based on the second exponent; and adding the second result to the first result in the accumulator;
   and wherein at least one step in the second instruction sequence is executed simultaneously with a step in the first instruction sequence to pipeline first and second instruction sequences.

7. A method of operating a digital processing system having only fixed point arithmetic hardware to multiply a fixed point number whose value is only known at runtime by a floating point constant known at compile-time comprising:
   a) storing a set of fixed point values for a runtime variable in contiguous memory locations;
   b) storing a set of mantissa-exponent values in fixed point form in contiguous memory locations, each mantissa-exponent value containing a fixed point mantissa derived from a predetermined floating point constant and an fixed point exponent derived from a predetermined floating point constant at compile-time, the fixed point mantissa and fixed point exponent together representing predetermined floating point constant; and
   c) performing a matrix multiplication comprising:
      1) multiplying a selected fixed point mantissa extracted from a selected mantissa-exponent value by a selected fixed point value for a runtime variable to calculate a first intermediate number; and
      2) shifting bits of the first intermediate number to the left or right based on the value of the selected fixed point exponent extracted from a selected mantissa-exponent value to obtain a first result that is equal to the fixed point multiplication product of the fixed point number for the runtime variable and the floating point constant known at compile-time.

8. The method of claim 7 further comprising:
   prior to performing the matrix multiplication, placing an address of the set of fixed point values for the runtime variable in a first index register and placing an address of the set of mantissa-exponent values in a second index register, and
   adjusting addresses in the first and second index registers during the matrix multiplication to point to the selected mantissa-exponent value and the selected fixed point value for the runtime variable for a current multiply operation.

9. The method of claim 7 wherein each mantissa-exponent value is stored in a single word of memory that is read in a single cycle.

10. The method of claim 7 wherein an exponent in a mantissa-exponent value is a 2's complement number.

11. The method of claim 7 further comprising deriving a mantissa by a process that includes scaling by dividing a floating point constant by a selected maximum value.

12. A system comprising:
   a fixed point processor that executes stored instructions;
   a set of fixed point values for a runtime variable in contiguous memory locations;
   a set of mantissa-exponent values in fixed point form in contiguous memory locations, each mantissa-exponent value containing a fixed point mantissa derived from a predetermined floating point constant and an fixed point exponent derived from a predetermined floating point constant at compile-time; and
   means for extracting a first fixed point mantissa and a first fixed point exponent from a word of memory containing the mantissa-exponent value; and
   means for executing a first instruction that multiplies the first fixed point mantissa by a first fixed point data value to generate a first fixed point result and shift bits in the first fixed point result right or left based on the first fixed point exponent.

13. The system of claim 12 wherein the first fixed point exponent is stored in 2's complement form and the means for executing a first instruction further comprises means for shifting in a first direction for positive values of the first fixed point exponent and shifting in a second direction for negative values of the first fixed point exponent.

14. The system of claim 12 further comprising means for executing a second instruction for matrix multiplication comprising a first index register containing an address of one of the set of fixed point values for the runtime variable and a second index register containing an address of one of the set of mantissa-exponent values, and
   means for adjusting addresses in the first and second index registers during the matrix multiplication to point to a selected mantissa-exponent value and a selected fixed point value for the runtime variable for use in a current multiply operation.

15. The system of claim 14 wherein the means for executing a second instruction for matrix multiplication further comprises means for pipelining the execution of the second instruction with the execution of the first instruction by simultaneously executing a step in the first instruction with a step in the second instruction.

* * * * *